(12) United States Patent
Oderkerk et al.

(10) Patent No.: US 10,688,765 B2
(45) Date of Patent: Jun. 23, 2020

(54) PROCESS FOR PRODUCING A MULTILAYER LAMINATE

(71) Applicant: BOREALIS AG, Vienna (AT)

(72) Inventors: Jeroen Oderkerk, Stenungsund (SE); Francis Costa, Linz (AT); Girish Suresh Galgali, Linz (AT); Bert Broeders, Beringen (BE); Mattias Bergqvist, Gothenburg (SE)

(73) Assignee: BOREALIS AG, Vienna (AT)

( * ) Notice: Subject to any disclaimer, the term of this patent is extended or adjusted under 35 U.S.C. 154(b) by 78 days.

(21) Appl. No.: 15/771,308

(22) PCT Filed: Oct. 18, 2016

(86) PCT No.: PCT/EP2016/074925
§ 371 (c)(1),
(2) Date: Apr. 26, 2018

(87) PCT Pub. No.: WO2017/076628
PCT Pub. Date: May 11, 2017

(65) Prior Publication Data
US 2019/0217591 A1   Jul. 18, 2019

(30) Foreign Application Priority Data
Nov. 4, 2015 (EP) .................................. 15192981

(51) Int. Cl.
*B32B 37/06* (2006.01)
*B32B 37/10* (2006.01)
(Continued)

(52) U.S. Cl.
CPC ........ *B32B 37/06* (2013.01); *B32B 17/10018* (2013.01); *B32B 17/10743* (2013.01); *B32B 27/08* (2013.01); *B32B 27/32* (2013.01); *B32B 37/10* (2013.01); *B32B 37/182* (2013.01); *C08F 210/02* (2013.01); *H01L 31/049* (2014.12); *H01L 31/0481* (2013.01);
(Continued)

(58) Field of Classification Search
CPC ...................................................... B32B 37/06
See application file for complete search history.

(56) References Cited

U.S. PATENT DOCUMENTS

2010/0269890 A1* 10/2010 Koch .................. C08L 23/08
136/251

FOREIGN PATENT DOCUMENTS

CN   104842616 A   8/2015
EP   0736065 B1   10/1996
(Continued)

OTHER PUBLICATIONS

Arkema Innovative Chemistry, Lotryl® 20MA08, Jun. 2013 (Year: 2013).*
(Continued)

*Primary Examiner* — Daniel H Lee
(74) *Attorney, Agent, or Firm* — Tarolli, Sundheim, Covell & Tummino LLP

(57) ABSTRACT

The present invention relates to a lamination process for producing a multilayer laminate which comprises a one or more substrate element(s) and one or more polymeric layer element(s), preferably to a lamination process for producing a photovoltaic (PV) module, and to a PV module laminate.

16 Claims, 1 Drawing Sheet

(51) Int. Cl.
| | |
|---|---|
| *B32B 17/10* | (2006.01) |
| *H01L 31/049* | (2014.01) |
| *B32B 27/08* | (2006.01) |
| *B32B 27/32* | (2006.01) |
| *B32B 37/18* | (2006.01) |
| *C08F 210/02* | (2006.01) |
| *H01L 31/048* | (2014.01) |
| *B32B 37/00* | (2006.01) |

(52) U.S. Cl.
 CPC ............ *B32B 37/003* (2013.01); *B32B 37/18* (2013.01); *B32B 2250/05* (2013.01); *B32B 2307/30* (2013.01); *B32B 2309/02* (2013.01); *B32B 2309/68* (2013.01); *B32B 2457/12* (2013.01); *C08F 2800/10* (2013.01); *C08F 2800/20* (2013.01)

(56) References Cited

FOREIGN PATENT DOCUMENTS

| | | |
|---|---|---|
| EP | 1309631 B1 | 5/2003 |
| EP | 1309632 B2 | 5/2003 |
| EP | 2508566 A1 | 10/2012 |
| ES | 2436113 T3 | 12/2013 |
| JP | 2014-157887 A | 8/2014 |
| WO | 2010/124189 A1 | 10/2010 |
| WO | 2011/160964 A1 | 12/2011 |

OTHER PUBLICATIONS

Randall, James, "A Review of High Resolution Liquid 13 Carbon Nuclear Magnetic Resonance Characterizations of Ethylene-Based Polymers", Rev. Macromol. Chem. Phys., C29(2 & 3), 201-317 (1989).

Zweifel, Hans., "Plastics Additives Handbook", 5th edition, 2001.

Heino, E-L, et al., "Rheological Characterization of Polyethylene Fractions", Proc. XIth Int. Congr. on Rheology, Brussels, Belgium, Aug. 17-21, 1992, pp. 360-362.

Klimesch, R., et al., "Polyethylene: High-pressure", Encyclopedia of Material Science and Technology, 2001, pp. 7181-7184.

Encyclopedia of Polymer Science and Engineering, vol. 6 (1986), pp, 383-410.

Kaye et al., "Definition of Terms Relating to the Non-Ultimate Mechanical Properties of Polymers", Pure & Appl. Chem., vol. 70, No. 3, pp. 701-754, 1998.

Heino, "The influence of molecular structure on some rheological properties of polyethylene", Annual Transactions of the Nordic Rheology Society, vol. 3, 1995.

Extended European Search Report for application No. 15192981.7-1706.

Office action for Japanese Application No. 2018-518698, dated Sep. 25, 2018.

Office action for Chinese Patent Application No. 201680062882.1, dated Dec. 5, 2018.

* cited by examiner

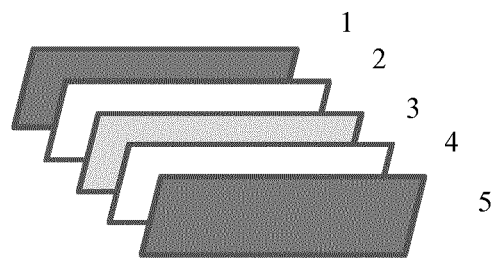

PROCESS FOR PRODUCING A MULTILAYER LAMINATE

The present invention relates to a lamination process for producing a multilayer laminate, preferably to a lamination process for producing a photovoltaic (PV) module, and to a PV module laminate.

BACKGROUND

Lamination of polymer layers on a rigid or flexible substrate of various materials is a well known technology and used in numerous technical fields. The polymer material used for the polymer layer can vary depending on the end application of the article comprising the multilayer laminate. For instance ethylene vinyl acetate (EVA) and other thermoplastic based polymers are conventionally used layer materials in lamination processes.

In general, the lamination of layer(s) to a substrate can be performed for instance by 1) so called cast extrusion, wherein at least part of the layers are produced on a premade substrate during the cast extrusion step or 2) by integrating premade substrate and premade layer(s) together under heat and pressure, typically in a vacuum in a laminator equipment.

For instance, lamination is one of the steps also used for producing well known photovoltaic modules, also known as solar cell modules. Photovoltaic (PV) modules produce electricity from light and are used in various kind of applications as well known in the field. The type of the photovoltaic module can vary. The modules have typically a multilayer structure, i.e. several different layer elements which have different functions. The layer elements of the photovoltaic module can vary with respect to layer materials and layer structure. The final photovoltaic module can be rigid or flexible.

The rigid photovoltaic module can for example contain a rigid protective front layer element, such as a glass element, front encapsulation layer element, a photovoltaic element, rear encapsulation layer element, a protective back layer element, which is also called a backsheet layer element and which can be rigid or flexible; and optionally e.g. an aluminium frame.

In flexible modules all the above elements are flexible, whereby the protective front layer element can be e.g. a fluorinated layer made from polyvinylfluoride (PVF) or polyvinylidenefluoride (PVDF) polymer, and the backsheet layer element is typically a polymeric layer element.

The above exemplified layer elements can be monolayer or multilayer elements.

All said terms have a well-known meaning in the art.

The state of the art encapsulation layers in flexible and rigid PV modules are typically made from ethylene vinyl acetate (EVA).

Moreover, there may be adhesive layer(s) between the layers of an element or between the different layer elements.

During the production of the PV module two or more premade elements of the PV module, which elements can be monolayer or multilayer elements are conventionally laminated together in a laminator equipment. Such lamination process normally comprises a step of heating the system, which heating step typically involves evacuation of air from the system, and a step pressurizing the system under heat and vacuum for the lamination to occur between the functionally different layer elements. In case of a PV multilayer element, the multilayer element, e.g. backsheet multilayer element, can be premade completely or partly before lamination to a different functional element, like rear encapsulation element.

Some end applications of laminated articles, like PV modules, bring demanding restrictions to the lamination process. E.g. in case of lamination process of layer elements of a PV module, it is always recommended that the application of pressure should be started only when the encapsulant layer reaches a temperature greater than its melting temperature and also after sufficient time that it is properly melted. This is very important as otherwise applying the pressure on insufficiently molten polymer or very close to its melting temperature will excert large stress on the fragile cells of the photovoltaic element causing their rupture.

In a lamination process using conventional laminator equipments, one very important and critical parameter for article manufacturers, like photovoltaic module manufacturers, is the lamination cycle time. The lamination cycle time has a marked impact on the expansion of production capacity and on the reduction of the production variable costs of a multilayer laminate, like PV module. Therefore there has been a constant attempt to develop various measures along the production value chain of a laminated article, like PV module, which could eventually result in shorter cycle time during lamination step.

One way to reduce the cycle time could be by starting the pressing immediate after the polymer starts melting. However, this approach is not suitable e.g. for EVA based layers, like encapsulant layers, even though EVA melts at temperature below 80° C. This is because EVA to be suitable e.g. as PV encapsulant material must usually have high VA content to get feasible flowability/processability behaviour. The conventional EVA with high VA content has then also very high $MFR_2$ (more than 15 g/10 min). If with such an encapsulant, pressing is started immediately after the EVA melts, large amount of encapsulant will flow out of the system due to its high melt flowability. Therefore EVA needs to be crosslinked simultaneously during the application of pressure, typically by peroxide. Also other thermoplasts are conventionally crosslinked during or before the lamination. Crosslinking of EVA and other thermoplasts can be performed using e.g. irradiation or chemical crosslinker like peroxide or silane condensation catalyst.

When e.g. EVA or other peroxide crosslinkable thermoplastic based encapsulant layer(s) of a PV module is crosslinked during lamination process with a peroxide, it is necessary that lamination temperature is high enough so that peroxide decomposes effectively to initiate the crosslinking reaction and it is also necessary to prolong the lamination time in order to complete the crosslinking reaction. Therefore, even with most effective peroxide, the total lamination time hardly can go below 10 minutes at lamination temperature 150° C. This means e.g. with EVA encapsulant layer, there is certain technical limitation to reduce lamination cycle time beyond certain minimum value. Furthermore, in e.g. peroxide crosslinked encapsulant layers (e.g. EVA), the formed volatiles and reactions products are needed to be expelled from the laminate assemble to ensure non blisters, bubble formation in the laminate, which volatiles removing step, again, increases the lamination cycle time.

A second way of reducing the cycle time is to shorten the pressure holding time as much as possible without sacrificing the module quality with respect to adhesion, bubble formation, etc. Again this approach is not suitable e.g. for EVA or other peroxide crosslinkable thermoplastic based layers that need crosslinking reaction and subsequent removal step of volatiles and/or by-products formed during the crosslink reaction.

As a third attempt to reduce the lamination cycle time of e.g. PV modules, the producers of laminator equipment have tried to design advanced laminator equipments with improved heating process or forced cooling steps, encapsulant layer producers design encapsulant layers (which are typically based on EVA) with faster crosslinking steps, etc. However, in most of these cases the solutions either end up with more expensive equipment need, like advanced laminator equipments or very limited lamination process robustness due to very strict process guideline, like fast cure EVA solution for encapsulant layer.

WO2010124189 of Bemis Associates describes an encapsulation layer based on a blend of terpolymer of ethylene with acrylate and glycidyl methacrylate comonomers together with a heat resistant copolymer (ethylene with glycidyl methacrylate comonomer). The blend may also comprise carrier polymer which is an ethylene polymer modified (copolymerized or grafted) with silane. The formed layer can be crosslinked by irradiation. Also a lamination process has been described, which is stated on p. 7 to be shorter than that of EVA based encapsulant, in one embodiment lamination press cycle times of 1 minute at about 155° C. and about 3 minutes at about 125° C. were given. In the experimental part, page 18 and 19, pressure of about 1 atm and temperature of about 110 to 175° C. for 1 to 15 minutes, preferably about 140 to 160° C. for about 3 to 5 minutes, or alternatively at 1 atm, temperature of about 120 to 140, or of 145 to 155° C., were given, and stated that lower temperatures will require longer times to ensure adequate adhesion. In examples the lamination is effected in a vacuum laminator at 155° C., 1 atm, with 7 min pump time and 8 min press time. EP2144301 of Borealis discloses the possibility to reduce lamination temperature in relation to laminating of crosslinked ethylene copolymer with silane and optionally with acrylate comonomer(s). On p. 7, the temperature, pressure and total lamination time of the lamination process has been indicated. The temperature during the lamination process means the set temperature in the laminator. No specific conditions for different lamination steps are given and, as already said, the benefits for the option for shorter lamination cycle relate to crosslinked encapsulation material.

There is a continuous need to develop further lamination process solutions for producing a multilayer laminates, like photovoltaic modules, to meet the demands required by the multilaminate, like PV module, producers in the further developing lamination industry, such as in the growing PV module industry.

FIGURES

FIG. 1 illustrates the layer elements (separated) of the preferable embodiment of the invention, namely a protective front layer element (1), a front encapsulation layer element (2), a photovoltaic element (3), a rear encapsulation layer element (4) and a protective back layer element (5) a photovoltaic module laminate.

DESCRIPTION OF THE INVENTION

The present invention is thus directed to a process for producing a multilayer laminate which comprises at least one substrate element and at least one polymeric layer element, wherein the polymeric layer element comprises a polymer composition comprising:

(a) a polymer, wherein said polymer (a) optionally bears functional group(s) containing units; and (b) silane group(s) containing units;

and wherein the process comprises the steps of:

(i) assembling step to arrange the at least one substrate element and the at least one polymeric layer element in form of a multilayer assembly;

(ii) heating step to heat up the multilayer assembly optionally in a chamber at evacuating conditions;

(iii) pressing step to build and keep pressure on the multilayer assembly at the heated conditions for the lamination of the assembly to occur; and (iv) recovering step to cool and remove the obtained multilayer laminate for later use;

wherein the pressing step (iii) is started when the at least one polymeric layer element reaches a temperature which is at least 3 to 10° C. higher than the melting temperature of the polymer (a) of said polymeric layer element; and wherein the duration of the pressing step (iii) is from 0.5 to 10 minutes;

wherein the polymer (a) has a melting temperature, Tm, of 100° C. or less, when measured as described below under "Determination methods", and a melt flow rate, $MFR_2$, of less than 20 g/10 min (according to ISO 1133 at 190° C. and at a load of 2.16 kg); and wherein no crosslinking agent selected from peroxide or silane condensation catalyst (SCC), which is selected from the SCC group of carboxylates of tin, zinc, iron, lead or cobalt or aromatic organic sulphonic acids, is introduced to the polymer (a) of the polymer composition before or during the lamination process.

The process of the invention for producing a multilayer laminate as defined above, below or in claims is referred herein also shortly as "lamination process".

The at least one polymeric layer element of the multilayer laminate of the lamination process, which comprises the polymer composition comprising a polymer (a) and the silane group(s) containing units (b), as defined above, below or in claims, is referred herein also shortly as "polymeric layer element" or "polymeric layer".

The polymer composition comprising a polymer (a) and the silane group(s) containing units (b), as defined above, below or in claims, is referred herein also shortly as "polymer composition".

The polymer (a), wherein said polymer (a) optionally bears functional group(s) containing units (b), as defined above, below or in claims, is referred herein also shortly as "polymer (a)".

The multilayer laminate of the lamination process which comprises the at least one substrate element and the at least one polymeric layer element, as defined above, below or in claims, is referred herein also shortly as "laminate"

The pressing step (iii) comprises two "substeps", 1) to build the pressure (also referred herein as "pressure build up" step) and 2) to keep the pressure (also referred herein as "holding the pressure"). The duration of the pressing step (iii) means thus the total duration of pressing step (iii), i.e. the sum of 1) the duration of pressure build up step and 2) the duration of holding the pressure step. The claimed expression "the pressing step (iii) is started when" means the starting of pressure build up "substep" of pressing step (iii).

Accordingly, the lamination process of the invention relates to the earlier mentioned lamination by integrating premade substrate and premade layer(s) together under heat and pressure, optionally in a vacuum in a laminator equipment.

The substrate element means herein a premade layer element which can be a monolayer element or a multilayer element. The substrate element can be polymeric or non-polymeric and flexible or rigid element, depending on the desired end application. Example of non-polymeric and rigid substate element is e.g. a glass layer element. Polymeric substrate element comprises a polymeric layer(s). If the polymeric substrate element is a multilayer element, then the multilayer element may be rigid or flexible and may consist of polymeric layers or polymeric and non-polymeric layers.

"Rigid" means herein that the element is stiff and can not be bended in a manner as flexible elements, and if bended, then typically the integrity of the element typically breaks easily causing permanet fractures, as is not the case with flexible element. A skilled person can easily differentiate a rigid and flexible layer element.

The polymeric layer element means herein a premade layer element which can be a polymeric monolayer element or a polymeric layer of a multilayer element. In case of such multilayer element, then at least one layer thereof comprises the polymer composition of the polymeric layer element. Moreover, in such polymeric multilayer element, then at least one layer, preferably one or both of the outer layer(s), of the polymeric multilayer element comprises the polymer composition.

It has been surprisingly found that the polymeric layer of the invention comprising the polymer composition, as defined above, below or in claims, can be laminated on a substrate element using markedly shorter lamination cycle time and preferably lower lamination temperature compared to prior art lamination processes, while using conventionally applied pressure and conventional lamination equipment.

Furthermore unexpectedly, the polymeric layer of the invention does not require any crosslinking reaction aided by a conventional crosslinking means. I.e. the lamination process can be carried out without crosslinking the polymeric layer element of the invention using peroxide or a conventional silane condensation catalyst (SCC), as defined above, below or in claims. Accordingly, the long lamination cycle time, which is required for lamination of e.g. EVA crosslinked polymer layers, can be avoided with the process of the invention and a final multilayer laminate can be obtained with desirable quality.

The present invention has unique features that not only enable very short lamination cycle time, but also such low cycle time is possible at temperatures at which EVA and other e.g. peroxide crosslinkable thermoplastic based encapsulant are usually not recommended for. Moreover, any drawbacks relating to silane-crosslinked/crosslinkable material, like premature crosslinking (scorch) or a further step of crosslinking, when heating in the presence of moisture is needed, can be avoided. Moroever, since no removal of volatile reaction products of the crosslinking reaction is needed, also the recovering step (iv) including cooling can be shortened Naturally, in the lamination process of the invention a laminate can be produced which comprises more than one such substrate element and more than one polymeric layer element. Furthermore, a laminate can comprise other layer elements, which are different form said substrate element and polymeric layer element and which can be polymeric or non-polymeric.

The term "polymeric" means herein that the element comprises at least 50 wt % of polymer (a) or a mixture of polymer (a) with other polymer(s), preferably at least 50 wt % of polymer (a).

It is preferred that the polymer (a) of the polymeric layer element is other than EVA.

In a preferable embodiment said at least one substrate element is adjacent to said at least one polymeric layer element.

The term "adjacent" means herein that said substrate element and the polymeric layer comprising the polymer composition are facing at each other. In some embodiments there can be an adhesive layer between the substrate and polymeric layer elements. Such adhesive layers has the function to improve the adhesion between the two elements and have a well known meaning in the lamination field. Preferably, there are no adhesive layer between the substrate and polymeric layer elements, i.e. the substrate element and polymeric layer element are in direct contact to each other.

In a preferable embodiment the lamination process a photovoltaic module is produced. Accordingly, the process is preferably a process as defined above, below or in claims for producing a photovoltaic module laminate comprising, in the given order, a protective front layer element, a front encapsulation layer element, a photovoltaic element, a rear encapsulation layer element and a protective back layer element; wherein at least one of the front encapsulation layer element or the rear encapsulation layer element, or both the front encapsulation layer element and the rear encapsulation layer element, comprise(s) a polymer composition comprising:

(a) a polymer, wherein said polymer (a) optionally bears functional group(s) containing units; and
(b) silane group(s) containing units; and wherein the process comprises the steps of:

(i) assembling step to arrange the protective front layer element, the front encapsulation layer element, the photovoltaic element, the rear encapsulation layer element and the protective back layer element, in given order, to form of a photovoltaic module assembly;

(ii) heating step to heat up the photovoltaic module assembly optionally in a chamber at evacuating conditions;

(iii) pressing step to build and keep pressure on the photovoltaic module assembly at the heated conditions for the lamination of the assembly to occur; and (iv) recovering step to cool and remove the obtained photovoltaic module assembly for later use;

wherein the pressing step (iii) is started when at least of front encapsulation layer element, back encapsulation layer element, or both encapsulation layer element and back encapsulation layer element, reache(s) a temperature which is at least 3 to 10° C. higher than the melting temperature of the polymer (a) of said respective encapsulation layer element; and wherein the duration of the pressing step (iii) is from 0.5 to 10 minutes;

wherein the polymer (a) has a melting temperature, Tm, of 100° C. or less, when measured as described below under "Determination methods", and a melt flow rate, $MFR_2$, of less than 20 g/10 min (according to ISO 1133 at 190° C. and at a load of 2.16 kg); and wherein no crosslinking agent selected from peroxide or silane condensation catalyst (SCC), which is selected from the SCC group of carboxylates of tin, zinc, iron, lead or cobalt or aromatic organic sulphonic acids, is introduced to the polymer (a) of the polymer composition before or during the lamination process.

The invention further provides a photovoltaic module laminate, comprising, in the given order, a protective front layer element, a front encapsulation layer element, a photovoltaic element, a rear encapsulation layer element and a protective back layer element; wherein at least one of the front encapsulation layer element or the rear encapsulation layer element, preferably both the front encapsulation layer element and the rear encapsulation layer element, comprise(s) a polymer composition comprising:

(a) a polymer of ethylene, wherein said polymer (a) optionally bears functional group(s) containing units; and (b) silane group(s) containing units;

wherein the polymer (a) has a melting temperature, Tm, of 100° C. or less, when measured as described below under "Determination methods", and a melt flow rate, $MFR_2$, of less than 20 g/10 min (according to ISO 1133 at 190° C. and at a load of 2.16 kg); and wherein no crosslinking agent selected from peroxide or silane condensation catalyst (SCC), which is selected from the SCC group of carboxylates of tin, zinc, iron, lead or cobalt or aromatic organic sulphonic acids, preferably from the SCC according to group C, as defined above or in claims, is present in the polymer of ethylene (a) of the polymer composition before or during the lamination process.

The following preferable embodiments, properties and subgroups of the lamination process, including the process for producing a PV module, the polymeric layer element, the polymer (a) and silane group(s) containing units (b) thereof as well as the PV module laminate, are independently generalisable so that they can be used in any order or combination to further define the suitable embodiments of the invention.

Polymer (a) and the Silane Group(s) Containing Units (b), as Well as the Polymer Composition of the at Least One Polymeric Layer of the Multilayer Laminate The polymer composition of the polymeric layer of the lamination process preferably comprises a polymer of ethylene (a) selected from:

(a1) a polymer of ethylene which optionally contains one or more comonomer(s) other than a polar comonomer of polymer (a2) and which bears functional groups containing units;

(a2) a polymer of ethylene containing one or more polar comonomer(s) selected from (C1-C6)-alkyl acrylate or (C1-C6)-alkyl (C1-C6)-alkylacrylate comonomer(s), and optionally bears functional group(s) containing units other than said polar comonomer; or (a3) a polymer of ethylene containing one or more alpha-olefin comonomer selected from (C1-C10)-alpha-olefin comonomer; and optionally bears functional group(s) containing units; and silane group(s) containing units (b).

The functional groups containing units of the polymer (a1) are other than said optional comonomer(s).

Accordingly, silane group(s) containing units (b) are always in combination with polymer (a) and with the preferable embodiments thereof.

It is preferred that the polymer composition of the polymeric layer of the lamination process comprises, preferably consists of, a polymer of ethylene (a) as defined above below or in claims;

silane group(s) containing units (b) as defined above below or in claims; and additive(s) and optionally filler(s), preferably additive(s), as defined below.

Further preferably the polymeric monolayer element or a polymeric layer of a multilayer element of the invention consists of the polymer composition of the invention.

As well known "comonomer" refers to copolymerisable comonomer units.

It is preferred that the comonomer(s) of polymer (a), if present, is/are other than vinyl acetate comonomer. Preferably, the polymeric layer is without (does not comprise) a copolymer of ethylene with vinyl acetate comonomer.

It is preferred that the comonomer(s) of polymer (a), if present, is/are other than glycidyl methacrylate comonomer. Preferably, the polymeric layer is without (does not comprise) a copolymer of ethylene with acrylate and glycidyl methacrylate comonomers.

The content of optional comonomer(s), if present in polymer (a1), polar commoner(s) of polymer (a2) or alpha-olefin comonomer(s) of polymer (a3), is preferably of 4.5 to 18 mol %, preferably of 5.0 to 18.0 mol %, preferably of 6.0 to 18.0 mol %, preferably of 6.0 to 16.5 mol %, more preferably of 6.8 to 15.0 mol %, more preferably of 7.0 to 13.5 mol %, when measured according to "Comonomer contents" as described below under the "Determination methods".

The silane group(s) containing units (b) and the polymer (a) can be present as a separate components, i.e. as blend (composition), in the polymer composition of the polymeric layer of the invention, or the silane group(s) containing units (b) can be present as a comonomer of the polymer (a) or as a compound grafted chemically to the polymer (a). In general, copolymerisation and grafting of the silane group(s) containing units to ethylene are well known techniques and well documented in the polymer field and within the skills of a skilled person.

In case of a blend, the silane group(s) containing units (b) component (compound) may, at least partly, be reacted chemically with the polymer (a), e.g. grafted to polymer (a), using optionally e.g. a radical forming agent, such as peroxide. Such chemical reaction may take place before or during the lamination process of the the invention.

Preferably the silane group(s) containing units (b) are present (bonded) in the polymer (a), when the premade polymeric layer element is introduced to the assembling step (i) of the lamination process of the invention. More preferably, the polymer (a) bears functional group(s) containing units, whereby said functional group(s) containing units are said silane group(s) containing units (b). In this embodiment the silane group(s) containing units (b) can be copolymerised or grafted to the polymer (a). The silane group(s) containing units (b) as the optional, and preferable, functional group(s) containing units are preferably present in said polymer (a) in form of comonomer units or in form of grafted compound.

In more preferable embodiment of the invention, the polymer (a) comprises functional group(s) containing units which are the silane group(s) containing units (b) as comonomer in the polymer (a). The copolymerisation provides more uniform incorporation of the units (b). Moreover, the copolymerisation does not require the use of peroxide which is typically needed for the grafting of said units to polyethylene. It is known that peroxide brings limitations to the choice of MFR of the polymer used as a starting polymer (during grafting the MFR of the polymer decreases) for a multilayer laminate and the by-products formed from peroxide can deteriorate the quality of the polymer, as discussed above.

The polymer composition more preferably comprises
polymer (a) which is selected from
- (a1) a polymer of ethylene which optionally contains one or more comonomer(s) other than the polar comonomer of polymer (a2) and which bears functional groups containing units other than said optional comonomer(s); or
- (a2) a polymer of ethylene containing one or more polar comonomer(s) selected from (C1-C6)-alkyl acrylate or (C1-C6)-alkyl (C1-C6)-alkylacrylate comonomer(s), and optionally bears functional group(s) containing units other than said polar comonomer; and silane group(s) containing units (b).

Furthermore, the comonomer(s) of polymer (a) is/are preferably other than the alpha-olefin comonomer as defined above.

In one preferable embodiment A1, the polymer composition comprises a polymer (a) which is the polymer of ethylene (a1) which bears the silane group(s) containing units (b) as the functional groups containing units (also referred herein as "polymer (a1) which bears the silane group(s) containing units (b)" or "polymer (a1)"). In this embodiment A1, the polymer (a1) preferably does not contain, i.e. is without, a polar comonomer of polymer (a2) or an alpha-olefin comonomer.

In one equally preferable embodiment A2,
the polymer composition comprises
a polymer (a) which is the polymer of ethylene (a2) containing one or more polar comonomer(s) selected from (C1-C6)-alkyl acrylate or (C1-C6)-alkyl (C1-C6)-alkylacrylate, preferably one (C1-C6)-alkyl acrylate, and bears functional group(s) containing units other than said polar comonomer; and silane group(s) containing units (b): more preferably the polymer composition comprises a polymer (a) which is the polymer of ethylene (a2) containing one or more polar comonomer(s) selected from (C1-C6)-alkyl acrylate or (C1-C6)-alkyl (C1-C6)-alkylacrylate comonomer(s), and bears the silane group(s) containing units (b) as the functional group(s) containing units (also referred as "polymer (a2) with the polar comonomer and the silane group(s) containing units (b)" or "polymer (a2)").

The "polymer (a1) or polymer (a2)" is also referred herein as "polymer (a1) or (a2)".

The combination of polymer (a1) or polymer (a2) as defined above, below or in claims, with silane group(s) containing units (b) further contributes to the benefit that the polymer (a) does not need to be crosslinked due to feasible flowability/processability properties thereof. Moreover, said combination does not form any significant volatiles during lamination process. Any decomposition products thereof could be formed only at a temperature close to 400° C. Therefore, the holding time during lamination can be shortented significantly. Also the quality of the obtained laminate is highly desirable, since any premature crosslinking, presence and removal of by-products, which are formed during the crosslinking reaction and may cause bubble formation, can be avoided.

The content of the polar comonomer present in the polymer (a2) is preferably of 4.5 to 18 mol %, preferably of 5.0 to 18.0 mol %, preferably of 6.0 to 18.0 mol %, preferably of 6.0 to 16.5 mol %, more preferably of 6.8 to 15.0 mol %, more preferably of 7.0 to 13.5 mol %, when measured according to "Comonomer contents" as described below under the "Determination methods". The polymer (a2) with the polar comonomer and the silane group(s) containing units (b) contains preferably one polar comonomer as defined above, below or in claims. In a preferable embodiment of A1, said polar comonomer(s) of polymer of ethylene (a2) is a polar comonomer selected from (C1-C4)-alkyl acrylate or (C1-C4)-alkyl methacrylate comonomer(s) or mixtures thereof. More preferably, said polymer (a2) contains one polar comonomer which is preferably (C1-C4)-alkyl acrylate comonomer.

The most preferred polar comonomer of polymer (a2) is methyl acrylate. The methyl acrylate has very beneficial properties such as excellent wettability, adhesion and optical (e.g. transmittance) properties, which contribute to the lamination process and to the quality of the obtained laminate. Moreover, the thermostability properties of methyl acrylate (MA) comonomer are also highly advantageous. For instance, methyl acrylate is the only acrylate which cannot go through the ester pyrolysis reaction, since does not have this reaction path. As a result, if the polymer (a2) with MA comonomer degrades at high temperatures, then there is no harmful acid (acrylic acid) formation which improves the quality and life cycle of the laminate, like PV module laminate. This is not the case e.g. with vinyl acetate of EVA or with other acrylates like ethyle acrylate (EA) or butyl acrylate (BA) which, on the contrary, can go through the ester pyrolysis reaction, and if degrade, would form the harmful acid and for the acrylates also volatile olefinic by-products.

$MFR_2$, of the polymer (a), preferably of the polymer (a1) or (a2), is preferably of less than 15, preferably from 0.1 to 15, preferably from 0.2 to 13, preferably from 0.3 to 13, more preferably from 0.4 to 13, g/10 min (according to ISO 1133 at 190° C. and at a load of 2.16 kg).

The polymer composition comprising the polymer (a) and the silane group(s) containing units (b), more preferably the polymer (a1) or (a2), thus enables to decrease the MFR of the polymer (a), preferably polymer (a1) or (a2), compared to prior art and thus offers higher resistance to flow under pressing step (iii) and/or (iv) recovering step. As a result, the preferable MFR can further contribute, if desired, to the quality of the final multilayer laminate, such as the preferable final PV module, and to the short lamination cycle time obtainable by the process of the invention.

The polymer composition comprising the polymer (a) and the silane group(s) containing units (b), more preferably the polymer (a1) or (a2), present in the polymeric layer has preferably a Shear thinning index, $SHI_{0.05/300}$, of 30.0 to 100.0, preferably of of 40.0 to 80.0, when measured according to "Rheological properties: Dynamic Shear Measurements (frequency sweep measurements)" as described below under "Determination Methods".

The preferable SHI range further contributes to the lamination process, e.g. the lamination process of a photovoltaic module laminate of the invention, since such preferable rheology property causes less stress on the PV cell element. Furthermore, the preferable rheology property contributes to the option to use lower melt flow rate, MFR, if desired. The preferable SHI thus further contributes to the quality of the final multilayer laminate, such as of the preferable final PV module, and to the short lamination cycle time of the process of the invention.

Furthermore, the combination of the preferable SHI and the preferable low MFR of the polymer composition, preferably of the polymer (a), more preferably the polymer (a1) or (a2), further contributes to a desirable high zero shear rate viscosity of the polymer composition, thereby further contributes to the reduction or prevention of the flow out of the material during lamination. And in this preferable embodiment the melt of said polymer (a), more preferably the polymer (a1) or (a2), further contributes to a proper wetting of various interfaces (layer elements) within the laminate. Accordingly, the combination of the preferable SHI and the preferable MFR range of the polymer composition, preferably of the polymer (a), more preferably the polymer (a1) or (a2), further contributes to the quality of the final multilayer laminate, such as of the preferable final PV module, and to the short lamination cycle time of the process of the invention.

As already mentioned, with the present preferable polymer composition the crosslinking of the polymeric layer element can be avoided which contributes to achieve the good quality of the final multilayer laminate and, additionally, to shorten the lamination cycle time without deteriorating the quality of the formed multilayer laminate. For instance, the recovering step (iv) of the process can be short, since time consuming removal of by-products, which are typically formed in the prior art peroxide crosslinking, is not needed.

The polymer (a), preferably of the polymer (a1) or (a2), has preferably a Melt Temperature of 70° C. or more, preferably 75° C. or more, more preferably 78° C. or more, when measured as described below under "Determination Methods". Preferably the upper limit of the Melt Temperature is 100° C. or below, preferably 95° C. or below.

Typically, and preferably the density of the polymer of ethylene (a), preferably of the polymer (a1) or (a2), is higher than 860 kg/m³. Preferably the density is not higher than 970 kg/m³, and preferably is from 920 to 960 kg/m³, according to ISO 1872-2 as described below under "Determination Methods".

The silane group(s) containing comonomer unit or compound as the silane group(s) containing units (b) is suitably a hydrolysable unsaturated silane compound represented by the formula $$R1SiR2qY3-q \quad (I)$$

wherein

R1 is an ethylenically unsaturated hydrocarbyl, hydrocarbyloxy or (meth)acryloxy hydrocarbyl group, each R2 is independently an aliphatic saturated hydrocarbyl group, Y which may be the same or different, is a hydrolysable organic group and q is 0, 1 or 2.

Special examples of the unsaturated silane compound are those wherein R1 is vinyl, allyl, isopropenyl, butenyl, cyclohexanyl or gamma-(meth)acryloxy propyl; Y is methoxy, ethoxy, formyloxy, acetoxy, propionyloxy or an alkyl- or arylamino group; and R2, if present, is a methyl, ethyl, propyl, decyl or phenyl group.

Further suitable silane compounds or, preferably, comonomers are e.g. gamma-(meth)acryl-oxypropyl trimethoxysilane, gamma(meth)acryloxypropyl triethoxysilane, and vinyl triacetoxysilane, or combinations of two or more thereof.

As a suitable subgroup of unit of formula (I) is an unsaturated silane compound or, preferably, comonomer of formula (II)

$$CH2=CHSi(OA)3 \quad (II)$$

wherein each A is independently a hydrocarbyl group having 1-8 carbon atoms, suitably 1-4 carbon atoms.

In one embodiment of silane group(s) containing units (b) of the invention, comonomers/compounds of formula (I), preferably of formula (II), are vinyl trimethoxysilane, vinyl bismethoxyethoxysilane, vinyl triethoxysilane, vinyl trimethoxysilane.

The amount of the silane group(s) containing units (b) present in the polymeric layer element, preferably in the polymer (a), is from 0.01 to 1.00 mol %, suitably from 0.05 to 0.80 mol %, suitably from 0.10 to 0.60 mol %, suitably from 0.10 to 0.50 mol %, when determined according to "Comonomer contents" as described below under "Determination Methods".

As already mentioned the silane group(s) containing units (b) are present in the polymer (a), more preferably in the polymer (a1) or (a2), as a comonomer.

In embodiment A1, the polymer (a1) contains silane group(s) containing units (b) as comonomer according to formula (I), more preferably silane group(s) containing units (b) as comonomer according to formula (II), more preferably silane group(s) containing units (b) according to formula (II) selected from vinyl trimethoxysilane, vinyl bismethoxyethoxysilane, vinyl triethoxysilane or vinyl trimethoxysilane comonomer, as defined above or in claims. Most preferably in this embodiment A1 the polymer (a1) is a copolymer of ethylene with vinyl trimethoxysilane, vinyl bismethoxyethoxysilane, vinyl triethoxysilane or vinyl trimethoxysilane comonomer, preferably with vinyl trimethoxysilane comonomer.

In the equally preferable embodiment A2, the polymer (a2) is a copolymer of ethylene with a (C1-C4)-alkyl acrylate comonomer and silane group(s) containing units (b) according to formula (I) as comonomer, more preferably and silane group(s) containing units (b) according to formula (II) as comonomer, more preferably and silane group(s) containing units (b) according to formula (II) selected from vinyl trimethoxysilane, vinyl bismethoxyethoxysilane, vinyl triethoxysilane or vinyl trimethoxysilane comonomer, as defined above or in claims. Most preferably in this embodiment A2 the polymer (a2) is a copolymer of ethylene with methyl acrylate comonomer and with vinyl trimethoxysilane, vinyl bismethoxyethoxysilane, vinyl triethoxysilane or vinyl trimethoxysilane comonomer, preferably with vinyl trimethoxysilane comonomer.

Most preferably the polymer (a) is a copolymer of ethylene (a1) with vinyl trimethoxysilane comonomer or a copolymer of ethylene (a2) with methylacrylate comonomer and with vinyl trimethoxysilane comonomer.

As said, the at least one polymeric layer is not subjected to any peroxide or silanol condensation catalyst (SCC), which is selected from the group of carboxylates of tin, zinc, iron, lead or cobalt or aromatic organic sulphonic acids, before or during the lamination process of the invention.

It is to be understood that the peroxide or SCC as defined above are those conventionally supplied for the purpose of crosslinking.

The polymer composition which is crosslinked for instance using the above crosslinking agents has a typical network, i.a. interpolymer crosslinks (bridges), as well known in the field. The crosslinking degree may vary depending on the end application.

In one embodiment no peroxide or silane condensation catalyst (SCC) which is selected from the SCC group of tin-organic catalysts or aromatic organic sulphonic acids the SCC is subjected to the polymeric layer element before or during the lamination process of the invention.

The silanol condensation catalyst (SCC), which is not used for crosslinking the polymeric layer element before or during the lamination process, is more preferably selected from the group C of carboxylates of metals, such as tin, zinc, iron, lead and cobalt; from a titanium compound bearing a group hydrolysable to a Brönsted acid (preferably as described in WO 2011160964 of Borealis, included herein as reference), from organic bases; from inorganic acids; and from organic acids; suitably from carboxylates of metals, such as tin, zinc, iron, lead and cobalt, from titanium compound bearing a group hydrolysable to a Brönsted acid as defined above or from organic acids, suitably from dibutyl tin dilaurate (DBTL), dioctyl tin dilaurate (DOTL), particularly DOTL; titanium compound bearing a group hydrolysable to a Brönsted acid as defined above; or an aromatic organic sulphonic acid, which is suitably an organic sulphonic acid which comprises the structural element:

$$Ar(SO_3H)x \qquad (II)$$

wherein Ar is an aryl group which may be substituted or non-substituted, and if substituted, then suitably with at least one hydrocarbyl group up to 50 carbon atoms, and x is at least 1; or a precursor of the sulphonic acid of formula (II) including an acid anhydride thereof or a sulphonic acid of formula (II) that has been provided with a hydrolysable protective group(s), e.g. an acetyl group that is removable by hydrolysis. Such organic sulphonic acids are described e.g. in EP736065, or alternatively, in EP1309631 and EP1309632.

More preferably, the polymer (a) of the polymeric layer is not crosslinked before introducing to the lamination process or during the lamination process using peroxide, silanol condensation catalyst (SCC), which is selected from the group of carboxylates of tin, zinc, iron, lead or cobalt or aromatic organic sulphonic acids, preferably from the above preferable SCC according to group C, or electronic beam irradiation.

More preferably, also the layer element(s) which is/are in direct contact with the polymeric layer are without a crosslinking agent selected from peroxide or silanol condensation catalyst (SCC), which is selected from the group of carboxylates of tin, zinc, iron, lead or cobalt or aromatic organic sulphonic acids, preferably from the above preferable SCC according to group C.

It is preferred that the at least one polymeric layer of the multilayer laminate is not crosslinked with the crosslinking agent, as defined above, before introducing to or during the lamination process, or before or during the use of the multilayer laminate in the end application.

Accordingly, in one embodiment the polymer composition of the polymeric layer element of the invention suitably comprises additives other than fillers (like flame retardants (FRs)). Then the polymer composition comprises, preferably consists of, based on the total amount (100 wt %) of the polymer composition,
  90 to 99.9999 wt % of the polymer (a)
  0.01 to 1.00 mol % silane group(s) containing units (b) and
  suitably 0.0001 to 10 wt % of the additives.

The total amount of optional additives is suitably between 0.0001 and 5.0 wt %, like 0.0001 and 2.5 wt %.

The optional additives are e.g. conventional additives suitable for the desired end application and within the skills of a skilled person, including without limiting to, preferably at least antioxidant(s) and UV light stabilizer(s), and may also include metal deactivator(s), nucleating agent(s), clarifier(s), brightener(s), acid scavenger(s), as well as slip agent(s) or talc etc. Each additive can be used e.g. in conventional amounts, the total amount of additives present in the polymer composition being preferably as defined above. Such additives are generally commercially available and are described, for example, in "Plastic Additives Handbook", 5th edition, 2001 of Hans Zweifel.

In another embodiment the polymer composition of the polymeric layer element of the invention comprises in addition to the suitable additives as defined above also fillers, such as pigments, FRs with flame retarding amounts or carbon black. Then the polymer composition of the invention comprises, preferably consists of, based on the total amount (100 wt %) of the polymeric layer element,
  90 to 99.9999 wt %, suitably 40 to 70 wt %, of the polymer (a)
  0.01 to 1.00 mol % silane group(s) containing units (b) and
  up to 70 wt %, suitably 30 to 60 wt %, of additives and filler(s).

As non-limiting examples, the optional filler(s) comprise Flame Retardants, such as magensiumhydroxide, ammounium polyphosphate etc.

In the preferred embodiment the polymer composition comprises, preferably consists of,
  30 to 90 wt %, suitably 40 to 70 wt %, of the polymer (a)
  0.01 to 1.00 mol % silane group(s) containing units (b) and
  0.0001 to 10 wt % additives and optionally fillers, preferably 0.0001 to 10 wt % additives.

In a preferable embodiment the polymer composition of the polymeric layer element consists of the polymer (a) as the only polymeric component(s). "Polymeric component(s)" exclude herein any carrier polymer(s) of optional additive or filler product(s), e.g. master batche(s) of additive(s) or, respectively, filler(s) together with the carrier polymer, optionally present in the polymer composition of the polymeric layer. Such optional carrier polymer(s) are calculated to the amount of the respective additive or, respectively, filler based on the amount (100%) of the polymer composition of the polymeric layer.

It is preferred that at least one layer of the polymeric layer element consists of the polymer composition of the invention.

The polymer (a) of the polymer composition of the polymeric layer element can be e.g. commercially available or can be prepared according to or analogously to known polymerization processes described in the chemical literature.

In a preferable embodiment the polymer (a), preferably the polymer (a1) or (a2), is produced by polymerising ethylene suitably with silane group(s) containing comonomer (=silane group(s) containing units (b)) as defined above and optionally with one or more other comonomer(s) in a high pressure (HP) process using free radical polymerization in the presence of one or more initiator(s) and optionally using a chain transfer agent (CTA) to control the MFR of the polymer. The HP reactor can be e.g. a well known tubular or autoclave reactor or a mixture thereof, suitably a tubular reactor. The high pressure (HP) polymerisation and the adjustment of process conditions for further tailoring the other properties of the polymer depending on the desired end application are well known and described in the literature, and can readily be used by a skilled person. Suitable polymerisation temperatures range up to 400° C., suitably from 80 to 350° C. and pressure from 70 MPa, suitably 100 to 400 MPa, suitably from 100 to 350 MPa. The high pressure polymerization is generally performed at pressures of 100 to 400 MPa and at temperatures of 80 to 350° C. Such processes are well known and well documented in the literature and will be further described later below.

The incorporation of the comonomer(s), if present, and optionally, and preferably, the silane group(s) containing units (b) suitably as comonomer as well as comonomer(s) and the control of the comonomer feed to obtain the desired final content of said comonomers and of optional, and preferable, silane group(s) containing units (b) as the comonomer can be carried out in a well known manner and is within the skills of a skilled person.

Further details of the production of ethylene (co)polymers by high pressure radical polymerization can be found i.a. in the Encyclopedia of Polymer Science and Engineering, Vol. 6 (1986), pp 383-410 and Encyclopedia of Materials: Science and Technology, 2001 Elsevier Science Ltd.: "Polyethylene: High-pressure, R. Klimesch, D. Littmann and F.-O. Mating pp. 7181-7184.

Such HP polymerisation results in a so called low density polymer of ethylene (LDPE), herein with the optional (polar) comonomer as defined above or in claims and with optional, and preferable silane group(s) containing comonomer as the silane group(s) containing units (b). The term LDPE has a well known meaning in the polymer field and describes the nature of polyethylene produced in HP, i.e the typical features, such as different branching architecture, to distinguish the LDPE from PE produced in the presence of an olefin polymerisation catalyst (also known as a coordination catalyst). Although the term LDPE is an abbreviation for low density polyethylene, the term is understood not to limit the density range, but covers the LDPE-like HP polyethylenes with low, medium and higher densities.

Lamination Process of the Invention

The substrate element and the polymeric layer element are typically premade before the assembling thereof to a form of multilaminate assembly. The premade substrate element and the premade polymeric layer element can be produced using conventional processes. Typically the polymeric layer element is produced by cast extrusion (e.g. in case of a polymeric monolayer element) or by coextrusion (e.g. in case of a polymeric multilayer element). The coextrusion can be carried out by cast extrusion or by blown film extrusion which both are very well known processes in the film production field and within the skills of a skilled person.

The thickness of the premade substrate element and the premade polymeric layer element, as well as any additional elements, of the multilayer laminate can vary depending on the desired end application and can be chosen accordingly by a person skilled in the field. The following process conditions apply to the process for producing the multilayer laminate and to the preferable process for producing the photovoltaic module of the invention.

The lamination process is carried out in a laminator equipment which can be e.g. any conventional laminator which is suitable for the multilaminate to be laminated. The choice of the laminator is within the skills of a skilled person. Typically the laminator comprises a chamber wherein the heating, optional, and preferable, evacuation, pressing and recovering (including cooling) steps (ii)-(iv) take place.

The duration of the heating step (ii) is preferably 0.5 to 7 minutes, preferably 1 to 6 minutes, suitably 1.5 to 5 minutes. The heating step (ii) can be and is typically done step-wise.

Pressing step (iii) is preferably started when the at least one polymeric layer element reaches a temperature which is 3 to 10° C. higher than the melting temperature of the polymer (a), preferably of the polymer (a1) or (a2), of said polymeric layer element.

The pressing step (iii) is preferably started when the at least one polymeric layer element reaches a temperature of at least of 85° C., suitably to 85 to 150, suitably to 85 to 148, suitably 85 to 140, preferably 90 to 130, preferably 90 to 120, preferably 90 to 115, preferably 90 to 110, preferably 90 to 108,° C.

The duration of the pressing step (iii) (i.e. the total duration of the pressing step (iii)) is preferably from 0.5 to 10, preferably 0.5 to 9, preferably 0.5 to 8, preferably 0.5 to 7, more preferably 0.5 to 6, more preferably 0.5 to 5, more preferably 1.0 to 5, minutes.

At the pressing step (iii), the duration of the pressure build up is preferably 0.5 to 3 minutes, preferably 0.7 to 2.5 minutes. The pressure built up to the desired level during pressing step can be done either in one step or can be done in multiple steps.

At the pressing step (iii), the duration of holding the pressure is preferably 0.5 to 9, preferably 0.5 to 8, preferably 0.5 to 7, preferably 0.5 to 5, preferably 0.5 to 3, minutes.

Preferably, at the pressing step (iii), the duration of the pressure build up time is 0.5 to 3 minutes, the duration of holding the pressure is preferably 0.5 to 9, preferably 0.5 to 8, preferably 0.5 to 7, preferably 0.5 to 5, preferably 0.5 to 3, minutes, and the total duration of the pressing step (iii) is preferably 0.5 to 10, preferably 0.5 to 9, preferably 0.5 to 8, preferably 0.5 to 7, more preferably 0.5 to 6, more preferably 0.5 to 5, more preferably 1.0 to 5, minutes.

The total duration (i.e. the sum) of the heating step (ii) and pressing step (iii) is preferably less than 20, preferably from 2 to 20, suitably 2 to 15, suitably 2 to 10, preferably 2 to 8, preferably 2 to 6, more preferably 3 to 5, minutes.

The pressure used in the pressing step (iii) is preferably up to 1000 mbar, preferably 500 to 900 mbar.

The lamination process can be used for producing a PV module, construction element, safety glass for buildings or vehicles, etc.

Lamination Process of the Invention for Producing PV Module

The lamination process according to invention is preferably for producing a multilayer laminate which is a photovoltaic module, comprising, in the given order, a protective front layer element, preferably a front glass layer element, a front encapsulation layer element, a photovoltaic element, a rear encapsulation layer element and a protective back layer element; wherein any one or more of the front encapsulation layer element, rear encapsulation layer element or protective back layer element, suitably one or both of the front encapsulation layer element or the rear encapsulation layer element, preferably both the front encapsulation layer element and the rear encapsulation layer element, is/are said polymeric layer element(s);

and any one or more of protective front layer element, the photovoltaic element or protective back layer element, is/are said substrate layer element(s).

The lamination process according to invention is preferably for producing a photovoltaic module, wherein the photovoltaic module comprises, in the given order, a protective front layer element, preferably a front glass layer element, a front encapsulation layer element, a photovoltaic element, a rear encapsulation layer element and a protective back layer element, wherein one or both of the front encapsulation layer element or the rear encapsulation layer element, preferably both the front encapsulation layer element and the rear encapsulation layer element, is/are said polymeric layer element(s);

and wherein the pressing step (iii) is started when at least one of said front and/or rear encapsulation layer element(s) reach(es) a temperature which is at least 3 to 10° C. higher than the melting temperature of the polymer of ethylene (a) present in said front and/or encapsulation layer element.

The at least one polymeric layer can be a monolayer or a multilayer element. In case of front and/or rear encapsulation layer element are as the polymeric layer, then said encapsulation layer element(s) is/are preferably said polymeric monolayer element(s). If both front encapsulation layer element and rear encapsulation layer element are of polymeric material, then the polymeric material in front and rear encapsulation layer elements can be same or different, preferably same.

The protective backlayer element is also known as "backsheet layer element". Both terms are used herein below.

Backsheet layer element can be a polymeric or non-polymeric and flexible or rigid layer element. Polymeric backsheet layer element can be mono- or multilayer element and comprises at least one polymeric layer. Rigid backsheet layer element can be mono- or multilayer element and comprises at least one rigid layer. Glass layer is an example of rigid backsheet element.

Backsheet layer element can also represent a substrate element or a polymeric layer element of the process of the invention. If the backsheet layer element represents a polymeric layer element, then it naturally must be polymeric. The backsheet layer element is preferably a substrate element. The backsheet layer element is most preferably a polymeric backsheet layer element.

The "photovoltaic element" means that the element has photovoltaic activity. The photovoltaic element can be e.g. an element of photovoltaic cell(s), which has a well known meaning in the art. Silicon based material, e.g. crystalline silicon, is a non-limiting example of materials used in photovoltaic cell(s). Crystalline silicon material can vary with respect to crystallinity and crystal size, as well known to a skilled person. Alternatively, the photovoltaic element can be a substrate layer on one surface of which a further layer or deposit with photovoltaic activity is subjected, for example a glass layer, wherein on one side thereof an ink material with photovoltaic activity is printed, or a substrate layer on one side thereof a material with photovoltaic activity is deposited. For instance, in well-known thin film solutions of photovoltaic elements e.g. an ink with photovoltaic activity is printed on one side of a substrate, which is typically a glass substrate.

The photovoltaic element is most preferably an element of photovoltaic cell(s). "Photovoltaic cell(s)" means herein a layer element(s) of photovoltaic cells together with connectors.

The PV module may comprise other layer elements as well, as known in the field of PV modules. Moreover, any of the other layer elements can be mono or multilayer elements.

In some embodiments there can be an adhesive layer between the the different layer layer elements and/or between the layers of a multilayer element, as well known in the art. Such adhesive layers has the function to improve the adhesion between the two elements and have a well known meaning in the lamination field. The adhesive layers are differentiated from the other functional layer elements of the PV module, e.g. those as specified above, below or in claims, as evident for a skilled person in the art.

As well known in the PV field, the thickness of the above mentioned elements, as well as any additional elements, of the laminated photovoltaic module of the invention can vary depending on the desired photovoltaic module embodiment and can be chosen accordingly by a person skilled in the PV field.

All the above elements of the photovoltaic module have a well known meaning. The protective front layer element, preferably a front glass layer element, a front encapsulation layer element, a photovoltaic element, a rear encapsulation layer element and a backsheet layer element other than the polymeric layer element of the invention can be produced in a manner well known in the photovoltaic field or are commercially available.

The polymer composition of the polymeric layer element of the invention as any of the above elements can be commercially available or be produced as defined above under "Polymer (a) and the silane group(s) containing units (b) of the at least one polymeric layer of the multilayer laminate".

As said, the thickness of the different layer elements of PV module laminate can vary depending on the type of the PV module and the material of the layer elements, as well known for a skilled person.

As a non-limiting example only, the thickness of the front and back encapsulation monolayer or multilayer element is typically up to 2 mm, preferably up to 1 mm, typically 0.3 to 0.6 mm.

As a non-limiting example only, the thickness of the rigid protective front layer element, e.g. glass layer, is typically up to 10 mm, preferably up to 8 mm, preferably 2 to 4 mm. As a non-limiting example only, the thickness of the flexible protective front layer element, e.g. polymeric (multi)layer element, is typically up to 700, like 90 to 700, suitably 100 to 500, such as 100 to 400, μm.

As a non-limiting example only, the thickness of the flexible protective back (backsheet) layer element, e.g. polymeric (multi)layer element, is typically up to 700, like 90 to 700, suitably 100 to 500, such as 100 to 400, μm. The protective (backsheet) layer element can be a polymeric mono or multilayer element.

As a non-limiting example only, the thickness of the rigid protective back (backsheet) layer element, e.g. glass layer, is typically up to 10 mm, preferably up to 8 mm, preferably up to 4 mm, preferably 2 to 4 mm.

As a non-limiting example only, the thickness of a photovoltaic element, e.g. an element of monocrystalline photovoltaic cell(s), is typically between 100 to 500 microns.

It is also to be understood that part of the elements can be in integrated form, i.e. two or more of said PV elements can be integrated together, preferably by lamination, before the elements of the assembly step (i) are introduced to said step (i).

Accordingly, the process is preferably a process as defined above, below or in claims for producing a photovoltaic module laminate comprising, in the given order, a protective front layer element, a front encapsulation layer element, a photovoltaic element, a rear encapsulation layer element and a protective back layer element; wherein at least one of the front encapsulation layer element or the rear encapsulation layer element, or both the front encapsulation layer element and the rear encapsulation layer element, comprise(s) a polymer composition comprising:
  (a) a polymer, wherein said polymer (a) optionally bears functional group(s) containing units; and
  (b) silane group(s) containing units;
and wherein the process comprises the steps of:
  (i) assembling step to arrange the protective front layer element, the front encapsulation layer element, the photovoltaic element, the rear encapsulation layer element and the protective back layer element, in given order, to form of a photovoltaic module assembly;
  (ii) heating step to heat up the photovoltaic module assembly optionally, and preferably, in a chamber at evacuating conditions;
  (iii) pressing step to build and keep pressure on the photovoltaic module assembly at the heated conditions for the lamination of the assembly to occur; and
  (iv) recovering step to cool and remove the obtained photovoltaic module assembly for later use;
    wherein the pressing step (iii) is started when at least of front encapsulation layer element, back encapsulation layer element, or both encapsulation layer element and back encapsulation layer element, reache(s) a temperature which is at least 3 to 10° C. higher than the melting temperature of the polymer (a) of said respective encapsulation layer element; and
  wherein the duration of the pressing step (iii) is from 0.5 to 10 minutes; wherein the polymer (a) has
    a melting temperature, Tm, of 100° C. or less, when measured as described below under "Determination methods", and
    a melt flow rate, $MFR_2$, of less than 20 g/10 min (according to ISO 1133 at 190° C. and at a load of 2.16 kg); and
  wherein no crosslinking agent selected from peroxide or silane condensation catalyst (SCC), which is selected from the SCC group of carboxylates of tin, zinc, iron, lead or cobalt or aromatic organic sulphonic acids, preferably the SCC according to group C as defined above or in claims, is introduced to the polymer (a) of the polymer composition before or during the lamination process.

The above preferable conditions and durations as defined above under "Lamination process of the invention" apply, naturally, for the lamination process of the PV module laminate as well.

The invention further provides a photovoltaic module laminate, comprising, in the given order, a protective front layer element, a front encapsulation layer element, a photovoltaic element, a rear encapsulation layer element and a protective back layer element;
  wherein at least one of the front encapsulation layer element or the rear encapsulation layer element, preferably both the front encapsulation layer element and the rear encapsulation layer element, comprise(s) a polymer composition comprising:
    (a) a polymer of ethylene, wherein said polymer (a) optionally bears functional group(s) containing units; and
    (b) silane group(s) containing units;
  wherein the polymer (a) has
    a melting temperature, Tm, of 100° C. or less, when measured as described below under "Determination methods", and
    a melt flow rate, $MFR_2$, of less than 20 g/10 min (according to ISO 1133 at 190° C. and at a load of 2.16 kg); and
  wherein no crosslinking agent selected from peroxide or silane condensation catalyst (SCC), which is selected from the SCC group of carboxylates of tin, zinc, iron, lead or cobalt or aromatic organic sulphonic acids, preferably from the SCC according to group C, as defined above or in claims, is present in the polymer of ethylene (a) of the polymer composition before or during the lamination process.

Determination Methods

Unless otherwise stated in the description or in the experimental part, the following methods were used for the property determinations of the polymer composition, polar polymer and/or any sample preparations thereof as specified in the text or expereimental part.

Melt Flow Rate

The melt flow rate (MFR) is determined according to ISO 1133 and is indicated in g/10 min. The MFR is an indication of the flowability, and hence the processability, of the polymer. The higher the melt flow rate, the lower the viscosity of the polymer. The MFR is determined at 190° C. for polyethylene. MFR may be determined at different loadings such as 2.16 kg ($MFR_2$) or 5 kg ($MFR_5$).

Density

Low density polyethylene (LDPE): The density of the polymer was measured according to ISO 1183-2. The sample preparation was executed according to ISO 1872-2 Table 3 Q (compression moulding).

Comonomer Contents:

The content (wt % and mol %) of polar comonomer present in the polymer and the content (wt % and mol %) of silane group(s) containing units (preferably comonomer) present in the polymer composition (preferably in the polymer):

Quantitative nuclear-magnetic resonance (NMR) spectroscopy was used to quantify the comonomer content of the polymer composition or polymer as given above or below in the context. Quantitative $^1H$ NMR spectra recorded in the solution-state using a Bruker Advance III 400 NMR spectrometer operating at 400.15 MHz. All spectra were recorded using a standard broad-band inverse 5 mm probehead at 100° C. using nitrogen gas for all pneumatics. Approximately 200 mg of material was dissolved in 1,2-tetrachloroethane-$d_2$ (TCE-$d_2$) using ditertiarybutylhydroxytoluen (BHT) (CAS 128-37-0) as stabiliser. Standard single-pulse excitation was employed utilising a 30 degree pulse, a relaxation delay of 3 s and no sample rotation. A total of 16 transients were acquired per spectra using 2 dummy scans. A total of 32 k data points were collected per FID with a dwell time of 60 µs, which corresponded to to a spectral window of approx. 20 ppm. The FID was then zero filled to 64 k data points and an exponential window function applied with 0.3 Hz line-broadening. This setup was chosen primarily for the ability to resolve the quantitative signals resulting from methylacrylate and vinyltrimethylsiloxane copolymerisation when present in the same polymer.

Quantitative $^1H$ NMR spectra were processed, integrated and quantitative properties determined using custom spectral analysis automation programs. All chemical shifts were internally referenced to the residual protonated solvent signal at 5.95 ppm.

When present characteristic signals resulting from the incorporation of vinylacytate (VA), methyl acrylate (MA), butyl acrylate (BA) and vinyltrimethylsiloxane (VTMS), in various comonomer sequences, were observed (Randell89). All comonomer contents calculated with respect to all other monomers present in the polymer.

The vinylacytate (VA) incorporation was quantified using the integral of the signal at 4.84 ppm assigned to the *VA sites, accounting for the number of reporting nuclie per comonomer and correcting for the overlap of the OH protons from BHT when present:

$$VA = (I^*_{VA} - (I_{ArBHT})/2)/1$$

The methylacrylate (MA) incorporation was quantified using the integral of the signal at 3.65 ppm assigned to the 1MA sites, accounting for the number of reporting nuclie per comonomer:

$$MA = I_{1MA}/3$$

The butylacrylate (BA) incorporation was quantified using the integral of the signal at 4.08 ppm assigned to the 4BA sites, accounting for the number of reporting nuclie per comonomer:

$$BA = I_{4BA}/2$$

The vinyltrimethylsiloxane incorporation was quantified using the integral of the signal at 3.56 ppm assigned to the 1VTMS sites, accounting for the number of reporting nuclei per comonomer:

$$VTMS = I_{1VTMS}/9$$

Characteristic signals resulting from the additional use of BHT as stabiliser, were observed. The BHT content was quantified using the integral of the signal at 6.93 ppm assigned to the ArBHT sites, accounting for the number of reporting nuclei per molecule:

$$BHT = I_{ArBHT}/2$$

The ethylene comonomer content was quantified using the integral of the bulk aliphatic (bulk) signal between 0.00-3.00 ppm. This integral may include the 1VA (3) and αVA (2) sites from isolated vinylacetate incorporation, *MA and aMA sites from isolated methylacrylate incorporation, 1BA (3), 2BA (2), 3BA (2), *BA (1) and αBA (2) sites from isolated butylacrylate incorporation, the *VTMS and αVTMS sites from isolated vinylsilane incorporation and the aliphatic sites from BHT as well as the sites from polyethylene sequences. The total ethylene comonomer content was calculated based on the bulk integral and compensating for the observed comonomer sequences and BHT:

$$E(¼)*[I_{bulk} - 5*VA - 3*MA - 10*BA - 3*VTMS - 21*BHT]$$

It should be noted that half of the a signals in the bulk signal represent ethylene and not comonomer and that an insignificant error is introduced due to the inability to compensate for the two saturated chain ends (S) without associated branch sites.

The total mole fractions of a given monomer (M) in the polymer was calculated as:

$$fM = M/(E + VA + MA + BA + VTMS)$$

The total comonomer incorporation of a given monomer (M) in mole percent was calculated from the mole fractions in the standard manner:

$$M[\text{mol }\%] = 100*fM$$

The total comonomer incorporation of a given monomer (M) in weight percent was calculated from the mole fractions and molecular weight of the monomer (MW) in the standard manner:

$$M[\text{wt }\%] = 100*(fM*MW)/((fVA*86.09) + (fMA*86.09) + (fBA*128.17) + ((VTMS*148.23) + ((14VA-fMA-fBA-(VTMS)*28.05))$$

randall89: J. Randall, Macromol. Sci., Rev. Macromol. Chem. Phys. 1989, C29, 201.

If characteristic signals from other specific chemical species are observed the logic of quantification and/or compensation can be extended in a similar manor to that used for the specifically described chemical species. That is, identification of characteristic signals, quantification by integration of a specific signal or signals, scaling for the number of reported nuclei and compensation in the bulk integral and related calculations. Although this process is specific to the specific chemical species in question the approach is based on the basic principles of quantitative NMR spectroscopy of polymers and thus can be implemented by a person skilled in the art as needed.

Adhesion Test:

The adhesion test is performed on laminated strips, the encapsulant film and backsheet is peeled of in a tensile testing equipment while measuring the force required for this.

A laminate consisting of glass, 2 encapsulant films and backsheet is first laminated. Between the glass and the first encapsulant film a small sheet of Teflon is inserted at one of the ends, this will generate a small part of the encapsulants and backsheet that is not adhered to the glass. This part will be used as the anchoring point for the tensile testing device.

The laminate is then cut along the laminate to form a 15 mm wide strip, the cut goes through the backsheet and the encapsulant films all the way down to the glass surface.

The laminate is mounted in the tensile testing equipment and the clamp of the tensile testing device is attached to the end of the strip.

The pulling angle is 90° in relation to the laminate and the pulling speed is 14 mm/min.

The pulling force is measured as the average during 50 mm of peeling starting 25 mm into the strip. The average force over the 50 mm is divided by the width of the strip (15 mm) and presented as adhesion strength (N/cm).

Rheological Properties:

Dynamic Shear Measurements (Frequency Sweep Measurements)

The characterisation of melt of polymer composition or polymer as given above or below in the context by dynamic shear measurements complies with ISO standards 6721-1 and 6721-10. The measurements were performed on an Anton Paar MCR501 stress controlled rotational rheometer, equipped with a 25 mm parallel plate geometry. Measurements were undertaken on compression moulded plates, using nitrogen atmosphere and setting a strain within the linear viscoelastic regime. The oscillatory shear tests were done at 190° C. applying a frequency range between 0.01 and 600 rad/s and setting a gap of 1.3 mm.

In a dynamic shear experiment the probe is subjected to a homogeneous deformation at a sinusoidal varying shear strain or shear stress (strain and stress controlled mode, respectively). On a controlled strain experiment, the probe is subjected to a sinusoidal strain that can be expressed by $$\gamma(t) = \gamma_0 \sin(\omega t) \tag{1}$$

If the applied strain is within the linear viscoelastic regime, the resulting sinusoidal stress response can be given by $$\sigma(t) = \sigma_0 \sin(\omega t + \delta) \tag{2}$$

where

σ₀ and γ₀ are the stress and strain amplitudes, respectively

ω is the angular frequency

δ is the phase shift (loss angle between applied strain and stress response)

t is the time

Dynamic test results are typically expressed by means of several different rheological functions, namely the shear storage modulus G', the shear loss modulus, G", the complex shear modulus, G*, the complex shear viscosity, η*, the dynamic shear viscosity, the out-of-phase component of the complex shear viscosity η" and the loss tangent, tan δ which can be expressed as follows:

$$G' = \frac{\sigma_0}{\gamma_0}\cos\delta \text{ [Pa]} \quad (3)$$

$$G'' = \frac{\sigma_0}{\gamma_0}\sin\delta \text{ [Pa]} \quad (4)$$

$$G^* = G' + iG'' \text{ [Pa]} \quad (5)$$

$$\eta^* = \eta' - i\eta'' \text{ [Pa·s]} \quad (6)$$

$$\eta' = \frac{G''}{\omega} \text{ [Pa·s]} \quad (7)$$

$$\eta'' = \frac{G'}{\omega} \text{ [Pa·s]} \quad (8)$$

Besides the above mentioned rheological functions one can also determine other rheological parameters such as the so-called elasticity index EI(x). The elasticity index EI(x) is the value of the storage modulus, G' determined for a value of the loss modulus, G" of x kPa and can be described by equation (9).

$$EI(x)=G' \text{ for } (G''=x \text{ kPa) [Pa]} \quad (9)$$

For example, the EI(5 kPa) is the defined by the value of the storage modulus G', determined for a value of G" equal to 5 kPa.

Shear Thinning Index (SHI$_{0.05/300}$) is defined as a ratio of two viscosities measured at frequencies 0.05 rad/s and 300 rad/s, $\mu_{0.05}/\mu_{300}$.

REFERENCES

[1] Rheological characterization of polyethylene fractions" Heino, E. L., Lehtinen, A., Tanner J., Seppälä, J., Neste Oy, Porvoo, Finland, Theor. Appl. Rheol., Proc. Int. Congr. Rheol, 11th (1992), 1, 360-362
[2] The influence of molecular structure on some rheological properties of polyethylene", Heino, E. L., Borealis Polymers Oy, Porvoo, Finland, Annual Transactions of the Nordic Rheology Society, 1995).
[3] Definition of terms relating to the non-ultimate mechanical properties of polymers, Pure & Appl. Chem., Vol. 70, No. 3, pp. 701-754, 1998.

Melting Temperature, Crystallization Temperature (T$_{cr}$), and Degree of Crystallinity The melting temperature Tm of the used polymers was measured in accordance with ASTM D3418. Tm and Tcr were measured with Mettler TA820 differential scanning calorimetry (DSC) on 3±0.5 mg samples. Both crystallization and melting curves were obtained during 10° C./min cooling and heating scans between −10 to 200° C. Melting and crystallization temperatures were taken as the peaks of endotherms and exotherms. The degree of crystallinity was calculated by comparison with heat of fusion of a perfectly crystalline polymer of the same polymer type, e.g. for polyethylene, 290 J/g.

Experimental Part

Preparation of Examples (Copolymer of Ethylene with Methyl Acrylate Comonomer and with Vinyl Trimethoxysilane Comonomer)

Polymerisation of the polymer (a) of inventive inventive layer element, Inv. Ex.1-Inv.Ex2: Inventive polymer (a) was produced in a commercial high pressure tubular reactor at a pressure 2500-3000 bar and max temperature 250-300° C. using conventional peroxide initiatior. Ethylene monomer, methyl acrylate (MA) polar comonomer and vinyl trimethoxy silane (VTMS) comonomer (silane group(s) containing comonomer (b)) were added to the reactor system in a conventional manner. CTA was used to regulate MFR as well known for a skilled person. After having the information of the property balance desired for the inventive final polymer (a), the skilled person can control the process to obtain the inventive polymer (a).

The amount of the vinyl trimethoxy silane units, VTMS, (=silane group(s) containing units), the amount of MA and MFR$_2$ are given in the table 1.

The properties in below tables were measured from the polymer (a) as obtained from the reactor or from a layer sample as indicated below.

TABLE 1

Product properties of Inventive Examples

| Test polymer | Inv. Ex.1 | Inv. Ex 2 |
|---|---|---|
| Properties of the polymer obtained from the reactor | | |
| MFR$_{2,16}$, g/10 min | 2.0 | 4.5 |
| acrylate content, mol % (wt %) | MA 8.1 (21) | MA 8.6 (22) |
| Melt Temperature, ° C. | 92 | 90 |
| VTMS content, mol % (wt %) | 0.41 (1.8) | 0.38 (1.7) |
| Density, kg/m³ | 948 | 946 |
| SHI (0.05/300), 150° C. | 70 | 52 |

In above table 1 MA denotes the content of Methyl Acrylate comonomer present in the polymer and, respectively, VTMS content denotes the content of vinyl trimethoxy silane comonomer present in the polymer.

Lamination Examples

PV Module (60 Cells Solar Module) Elements:

Glass element (=protective front layer element): Solatex solar glass, supplied by AGC, length: 1632 mm and width: 986 mm, total thickness of 3.2 mm Front and rear encapsulant element: Both consisted of Inv. example 1, had same width and length dimensions as the glass element (the protective front layer element) and each had independently the total thickness of 0.45 mm PV Cell element: 60 monocrystalline solar cells, cell dimension156*156 mm, supplied by Tsec Taiwan, 2 buss bars, total thickness of 200 micron.

Backsheet element (=protective back layer element): DYMAT® PYE Standard backsheet (PET/PET/Primer), supplied by Covme, total thickness of 300 micron.

Preparation of PV Module (60 Cells Solar Module) Assembly for the Lamination:

Five PV module assembly samples were prepared as follows. The front protective glass element (Solatex AGC) was cleaned with isopropanol before putting the first encapsultant film on the solar glass. The solar glass element has the following dimensions: 1632 mm×986×3.2 mm (b*l*d). The front encapsulant element was cut in the same dimension as the solar glass element. The solar cells as PV cell element have been automatically stringed by 10 cells in series with a distance between the cells of 1.5 mm. After the front encapsulant element was put on the front protective glass element, then the solar cells were put on the front encapsulant element with 6 rows of each 10 cells with a distance between the rows of ±2.5 mm to have a total of 60 cells in the solar module as a standard module. Then the ends of the solar cells are soldered together to have a fully integrated connection as well known by the PV module producers. Further the rear encapsulant element was put on the obtained PV cell element and then the Coveme DYMAT PYE backsheet element which had a slightly bigger dimension in length and width as the front protective glass plate (±5 mm) was put on said the rear encapsulant element. The obtained PV module assembly samples were then subjected to a lamination process test as described below.

Lamination Process of the 60 Cells Solar Modules:

Laminator: ICOLAM 25/15, supplied by Meier Vakuumtechnik GmbH. Each PV module assembly sample was laminated in a Meier ICOLAM 25/15 laminator from Meier Vakuumtechnik GmbH with a laminator temperature setting of 145° C. and pressure setting of 800 mbar. Each sample was laminated in different conditions as given in table 2.

TABLE 2

Lamination process with duration of the steps of the process

| Lamination Test no. | Heating step (ii) with Evacuation (min) | Encapsulant temperature when pressing starts (° C.) | Pressure build up substep (iiia) of pressing step (iii) (min) | Holding the pressure substep (iiib) of pressing step (iii) (min) | Total time of steps (ii) + (iiia) and (iiib) of (iii) (min) |
|---|---|---|---|---|---|
| Test 1 | 6.0 | 105 | 1.0 | 8.0 | 15.0 |
| Test 2 | 6.0 | 100 | 2.0 | 2.0 | 10.0 |
| Test 3 | 5.0 | 95 | 2.0 | 1.0 | 8.0 |
| Test 4 | 3.5 | 95 | 1.5 | 1.0 | 6.0 |
| Test 5 | 2.5 | 93 | 1.5 | 1.0 | 5.0 |

The PV modules produced using the above conditions 1-5 were all perfect with no sign of cell breakage, bubble formation or air holes. The electroluminescence (EL) study of each of the modules show no cell cracks.

The delamination on the PV modules as produced in conditions 1-5 was tested by cutting a 1 cm strip of the backsheet-encapsulant layer from the complete module and then pulling the strip manually to check how easily the strip can be pulled. In all cases, it was observed that during pulling the backsheet encapsulant the assembly ruptured indicating adhesion strength greater than the mechanical strength of the backsheet. In all the samples, appearance of the delaminated surface showed combination of cohesive and adhesion failure at the interface indicating strong adhesive strength between glass and encapsulant.

The adhesion of the PV modules as produced in conditions 1-5 was tested according to adhesion method as described above under Determination methods". The test revealed that such failure takes place always at an adhesion strength greater than 150 N/cm.

The invention claimed is:

1. A process for producing a multilayer laminate which comprises at least one substrate element and at least one polymeric layer element,
    wherein the polymeric layer element comprises a polymer composition comprising:
        (a) a polymer, wherein said polymer (a) optionally bears functional group(s) containing units; and
        (b) silane group(s) containing units;
    and wherein the process comprises the steps of:
        (i) an assembling step to arrange the at least one substrate element and the at least one polymeric layer element in form of a multilayer assembly;
        (ii) a heating step to heat up the multilayer assembly optionally in a chamber at evacuating conditions;
        (iii) a pressing step to build and keep pressure on the multilayer assembly at the heated conditions for the lamination of the assembly to occur; and
        (iv) a recovering step to cool and remove the obtained multilayer laminate for later use;
    wherein the pressing step (iii) is started when the at least one polymeric layer element reaches a temperature which is 3 to 13° C. higher than the melting temperature of the polymer (a) of said polymeric layer element; and
    wherein the duration of the pressing step (iii) is from 0.5 to 10 minutes;
    wherein the polymer (a) has
        a melting temperature, Tm, of 100° C. or less, and
        a melt flow rate, $MFR_2$, of less than 20 g/10 min (according to ISO 1133 at 190° C. and at a load of 2.16 kg); and
    wherein no crosslinking agent selected from peroxide or silane condensation catalyst (SCC), which is selected from the SCC group of carboxylates of tin, zinc, iron, lead or cobalt or aromatic organic sulphonic acids, is introduced to the polymer (a) of the polymer composition before or during the lamination process.

2. The process according to claim 1, wherein the pressing step (iii) is started when the at least one polymeric layer element reaches a temperature which is 3 to 10° C. higher than the melting temperature of the polymer (a) of said polymeric layer element.

3. The process according to claim 1, wherein the pressing step (iii) is started when the at least one polymeric layer element reaches a temperature of at least of 85° C.

4. The process according to claim 1, wherein the duration of the heating step (ii) is 0.5 to 7 minutes.

5. The process according to claim 1, wherein at the pressing step (iii) the duration of building the pressure is 0.5 to 3 minutes, the duration of holding the pressure is 0.5 to 9 minutes, and the total duration of the pressing step (iii) is 1.0 to 10 minutes.

6. The process according to claim 1, wherein the total duration of the (ii) heating step and pressing step (iii) is less than 20 minutes.

7. The process according to claim 1, wherein the pressure used in the pressing step (iii) is up to 1000 mbar.

8. The process according to claim 1, wherein the polymer composition of the polymeric layer element of the lamination process comprises:

a polymer (a) selected from:
(a1) a polymer of ethylene which optionally contains one or more comonomer(s) other than a polar comonomer of polymer of ethylene (a2) and which bears units containing functional groups;
(a2) a polymer of ethylene containing one or more polar comonomer(s) selected from (C1-C6)-alkyl acrylate or (C1-C6)-alkyl (C1-C6)-alkylacrylate comonomer(s), and optionally bears units containing functional group(s) other than said polar comonomer; or
(a3) a polymer of ethylene containing one or more alpha-olefin comonomer selected from (C1-C10)-alpha-olefin comonomer; and optionally bears units containing functional group(s); and
silane group(s) containing units (b).

9. The process according to claim 1, wherein the polymer composition comprises:
a polymer (a) which is selected from:
(a1) a polymer of ethylene which optionally contains one or more comonomer(s) other than a polar comonomer of polymer of ethylene (a2) and which bears units containing functional groups other than said optional comonomer(s); or
(a2) a polymer of ethylene containing one or more polar comonomer(s) selected from (C1-C6)-alkyl acrylate or (C1-C6)-alkyl (C1-C6)-alkylacrylate comonomer(s), and optionally bears units containing functional group(s) other than said polar comonomer; and
silane group(s) containing units (b).

10. The process according to claim 1, wherein the polymer composition comprises:
a polymer (a) which is a polymer of ethylene (a1) which bears the silane group(s) containing units (b) as the units containing functional groups, wherein the polymer of ethylene (a1) does not contain, a polar comonomer of polymer of ethylene (a2) or an alpha-olefin comonomer; or
a polymer (a) which is a polymer of ethylene (a2) containing one or more polar comonomer(s) selected from (C1-C6)-alkyl acrylate or (C1-C6)-alkyl (C1-C6)-alkylacrylate, and bears silane group(s) containing units (b) as the units containing functional group(s) other than said polar comonomer.

11. The process according to claim 1, wherein the silane group(s) containing unit (b) is a hydrolysable unsaturated silane compound represented by the formula (I):

R1SiR2qY3-q     (I):

wherein;
R1 is an ethylenically unsaturated hydrocarbyl, hydrocarbyloxy or (meth)acryloxy hydrocarbyl group,
each R2 is independently an aliphatic saturated hydrocarbyl group,
Y which may be the same or different, is a hydrolysable organic group and,
q is 0, 1 or 2, the amount of the silane group(s) containing units (b) present in the layer in the polymer (a), is from 0.01 to 1.00 mol %.

12. The process according to claim 1, wherein polymer (a) is a copolymer of ethylene (a1) with vinyl trimethoxysilane comonomer or a copolymer of ethylene (a2) with methylacrylate comonomer and with vinyl trimethoxysilane comonomer.

13. The process according to claim 1, wherein the polymer (a) has at least one of the following properties:

melt flow rate, $MFR_2$, of less than 15, g/10 min (according to ISO 1133 at 190° C. and at a load of 2.16 kg),
Melting temperature, Tm, of 70° C. or more, when measured according to ISO 3146 or
Shear thinning index, $SHI_{0.05/300}$, of 30.0 to 100.0.

14. The process according to claim 1, for producing a multilayer laminate which is a photovoltaic module comprising, in the given order, a protective front layer element, a front encapsulation layer element, a photovoltaic element, a rear encapsulation layer element and a protective back layer element;
wherein,
any one or more of the front encapsulation layer element, rear encapsulation layer element or protective back layer element is/are said polymeric layer element(s);
and any one or more of protective front layer element, the photovoltaic element or protective back layer element, is/are said substrate layer element(s).

15. The process according to claim 1, for producing multilayer laminate which is a photovoltaic module, wherein the photovoltaic module comprises, in the given order, a protective front layer element, a front encapsulation layer element, a photovoltaic element, a rear encapsulation layer element and a protective back layer element,
wherein one or both of the front encapsulation layer element or the rear encapsulation layer element, is/are said polymeric layer element(s);
and wherein the pressing step (iii) is started when at least one of said front and/or rear encapsulation layer element(s) reach(es) a temperature which is 3 to 13° C. higher than the melting temperature of the polymer (a) present in said front and/or encapsulation layer element.

16. The process according to claim 1, for producing a multilayer laminate which is a photovoltaic module laminate comprising, in the given order, a protective front layer element, a front encapsulation layer element, a photovoltaic element, a rear encapsulation layer element and a protective back layer element; wherein at least one of the front encapsulation layer element or the rear encapsulation layer element, or both the front encapsulation layer element and the rear encapsulation layer element, comprise(s) a polymer composition comprising:
(a) a polymer, wherein said polymer (a) optionally bears functional group(s) containing units; and
(b) silane group(s) containing units;
and wherein the process comprises the steps of:
(i) an assembling step to arrange the protective front layer element, the front encapsulation layer element, the photovoltaic element, the rear encapsulation layer element and the protective back layer element, in given order, to form of a photovoltaic module assembly;
(ii) a heating step to heat up the photovoltaic module assembly optionally in a chamber at evacuating conditions;
(iii) a pressing step to build and keep pressure on the photovoltaic module assembly at the heated conditions for the lamination of the assembly to occur; and
(iv) a recovering step to cool and remove the obtained photovoltaic module assembly for later use;
wherein the pressing step (iii) is started when at least one of a front encapsulation layer element, a back encapsulation layer element, or both an encapsulation layer element and a back encapsulation layer element, reach(es) a temperature which is 3 to 13° C. higher than the melting temperature of the polymer (a) of said respective encapsulation layer element; and wherein the duration of the pressing step (iii) is from 0.5 to 10 minutes;

wherein the polymer (a) has a melting temperature, Tm, of 100° C. or less; and wherein no crosslinking agent selected from peroxide or silane condensation catalyst (SCC), which is selected from the SCC group of carboxylates of tin, zinc, iron, lead or cobalt or aromatic organic sulphonic acids, is introduced to the polymer (a) of the polymer composition before or during the lamination process.

* * * * *